(12) United States Patent
Nakayama et al.

(10) Patent No.: US 11,020,973 B2
(45) Date of Patent: Jun. 1, 2021

(54) PIEZOELECTRIC DEVICE, LIQUID EJECTING HEAD, LIQUID EJECTING APPARATUS, AND MANUFACTURING METHOD OF PIEZOELECTRIC DEVICE

(71) Applicant: SEIKO EPSON CORPORATION, Tokyo (JP)

(72) Inventors: Masao Nakayama, Shiojiri (JP); Yasuhiro Itayama, Chino (JP); Naoto Yokoyama, Matsumoto (JP); Eiju Hirai, Azumino (JP); Motoki Takabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 151 days.

(21) Appl. No.: 15/759,153

(22) PCT Filed: Aug. 31, 2016

(86) PCT No.: PCT/JP2016/003981
§ 371 (c)(1),
(2) Date: Mar. 9, 2018

(87) PCT Pub. No.: WO2017/043050
PCT Pub. Date: Mar. 16, 2017

(65) Prior Publication Data
US 2018/0297365 A1    Oct. 18, 2018

(30) Foreign Application Priority Data
Sep. 11, 2015  (JP) .............................. JP2015-180019

(51) Int. Cl.
*H01L 41/187*  (2006.01)
*H01L 41/319*  (2013.01)
(Continued)

(52) U.S. Cl.
CPC ............. *B41J 2/1628* (2013.01); *B41J 2/161* (2013.01); *B41J 2/1645* (2013.01); *B41J 2/1646* (2013.01);
(Continued)

(58) Field of Classification Search
None
See application file for complete search history.

(56) References Cited

U.S. PATENT DOCUMENTS 7,354,140 B2 * 4/2008 Hashizume .......... B41J 2/14233
347/72
2013/0258000 A1  10/2013 Ohashi et al.
(Continued)

FOREIGN PATENT DOCUMENTS

EP         0919383 A      6/1999
JP         2004-66652 A   3/2004
(Continued)

OTHER PUBLICATIONS

International Search Report dated Nov. 8, 2016 for PCT/JP2016/003981.

*Primary Examiner* — Alejandro Valencia
(74) *Attorney, Agent, or Firm* — Workman Nydegger

(57) ABSTRACT

Provided is a piezoelectric device including: a substrate (10) on which a plurality of recesses (12) are provided; a vibrating plate (50) which is provided on one surface side of the substrate; and a piezoelectric element (300) which is provided over the vibrating plate (50) and on which a first electrode (60), a piezoelectric layer (70), and a second electrode (80) are laminated from the substrate (10) side, in which the first electrode (60) is formed to have a first width which is smaller than a dimension of the recess in a parallel arrangement direction in the parallel arrangement direction of at least one recess (12), and the piezoelectric layer (70) is extended to the outer side of the first electrode (60) in the
(Continued)

parallel arrangement direction and has a second width which is greater than the first width and smaller than a width of the recess (12) in the parallel arrangement direction, the vibrating plate (50) contains a zirconium oxide layer (52), and when an area of the zirconium oxide layer (52) corresponding to the first electrode having the first width is set as a first area (p), areas of the zirconium oxide layer (52) corresponding to areas where the piezoelectric layer (70) is provided on the outer side of the first area (p) in the parallel arrangement direction are set as second areas (q), and areas of the zirconium oxide layer (52) corresponding to the recess (12) on the outer side of the second areas (q) in the parallel arrangement direction are set as third areas (r), the zirconium oxide layer (52) contains particulate crystal in the first area (p) at least on the first electrode (60) side in the thickness direction and contains columnar crystal in the third areas (r).

11 Claims, 13 Drawing Sheets

(51) Int. Cl.
  *B41J 2/16*   (2006.01)
  *H01L 41/08*  (2006.01)
  *H01L 41/09*  (2006.01)

(52) U.S. Cl.
  CPC ........ *H01L 41/081* (2013.01); *H01L 41/0815* (2013.01); *H01L 41/0973* (2013.01); *H01L 41/1876* (2013.01); *H01L 41/319* (2013.01)

(56) References Cited

U.S. PATENT DOCUMENTS

2014/0267508 A1* 9/2014 Ohashi ................ B41J 2/14233
  347/70
2016/0257119 A1* 9/2016 Nakayama .......... B41J 2/14233

FOREIGN PATENT DOCUMENTS

| JP | 2005-294438 A | 10/2005 |
| JP | 2013-202858 A | 10/2013 |
| JP | 2014-176985 A | 9/2014 |

* cited by examiner

[Fig. 1]
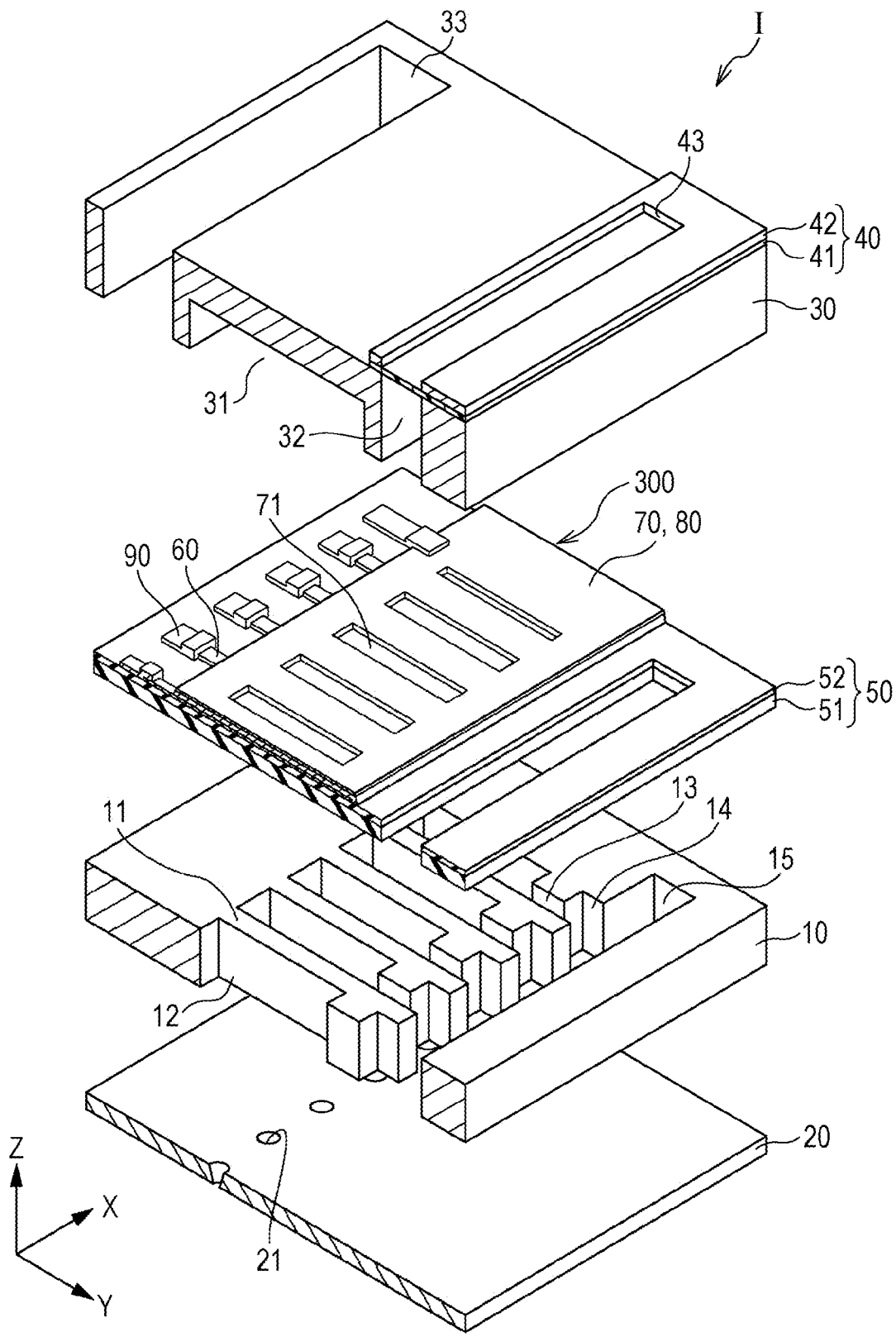

[Fig. 2A]
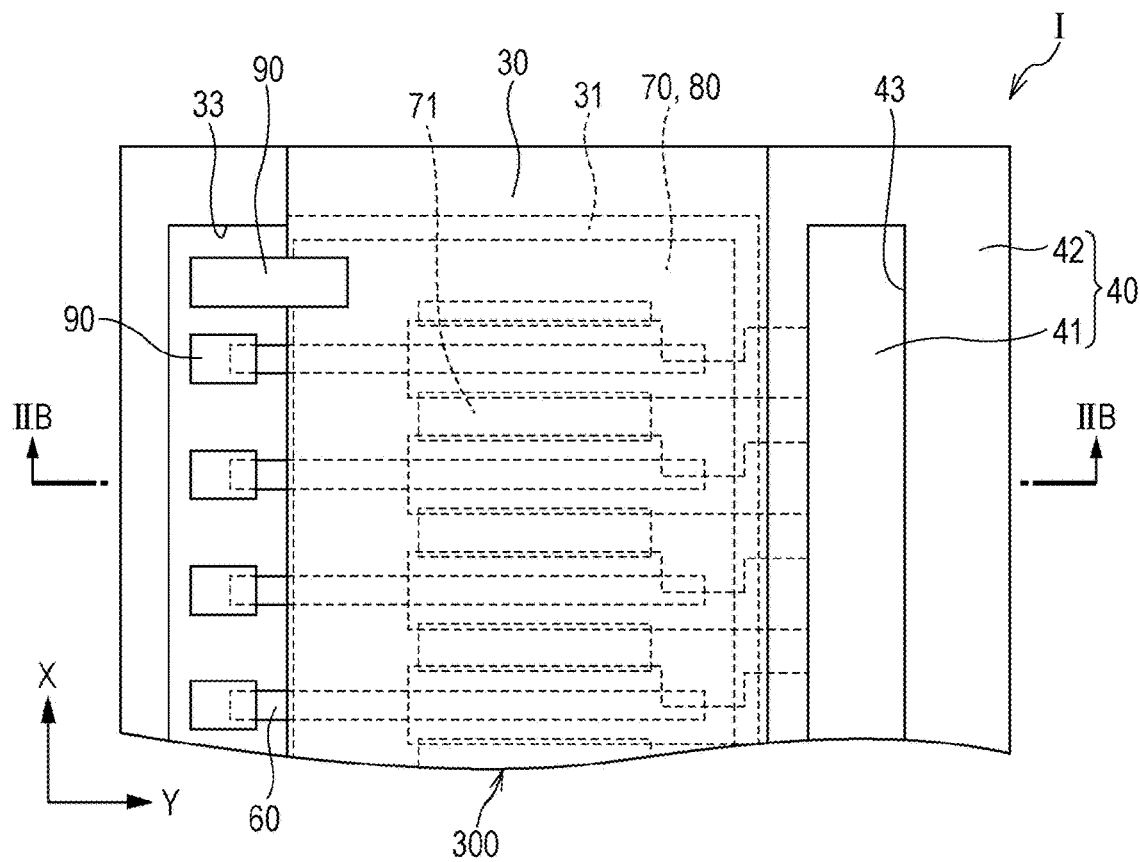
[Fig. 2B]
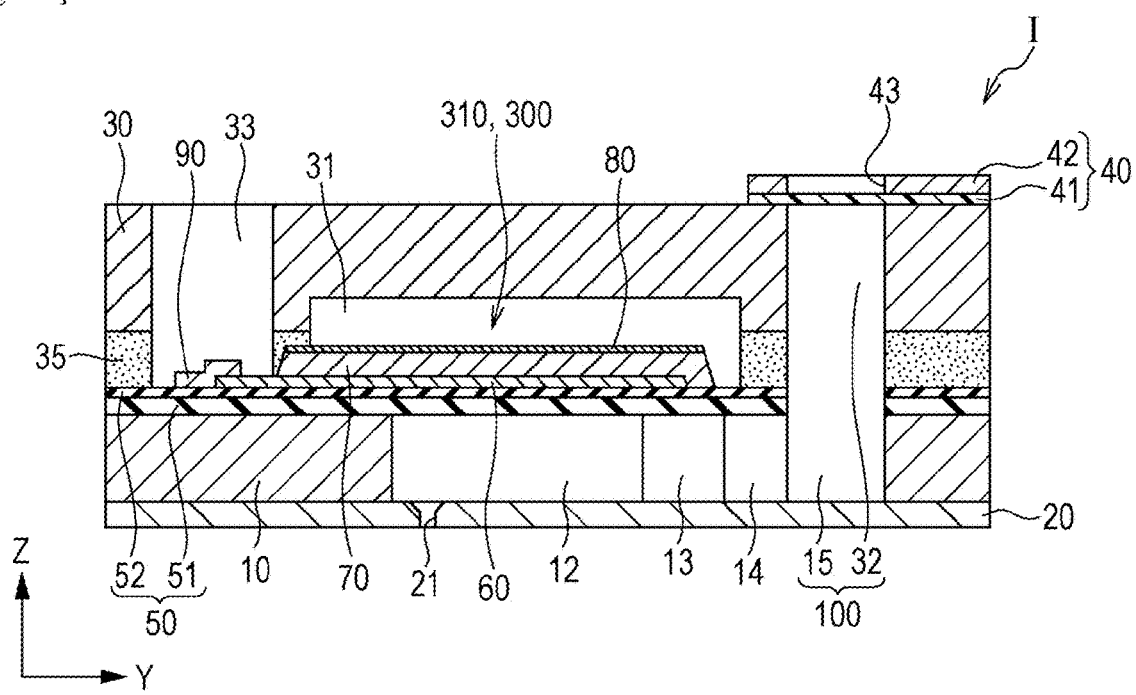

[Fig. 3]
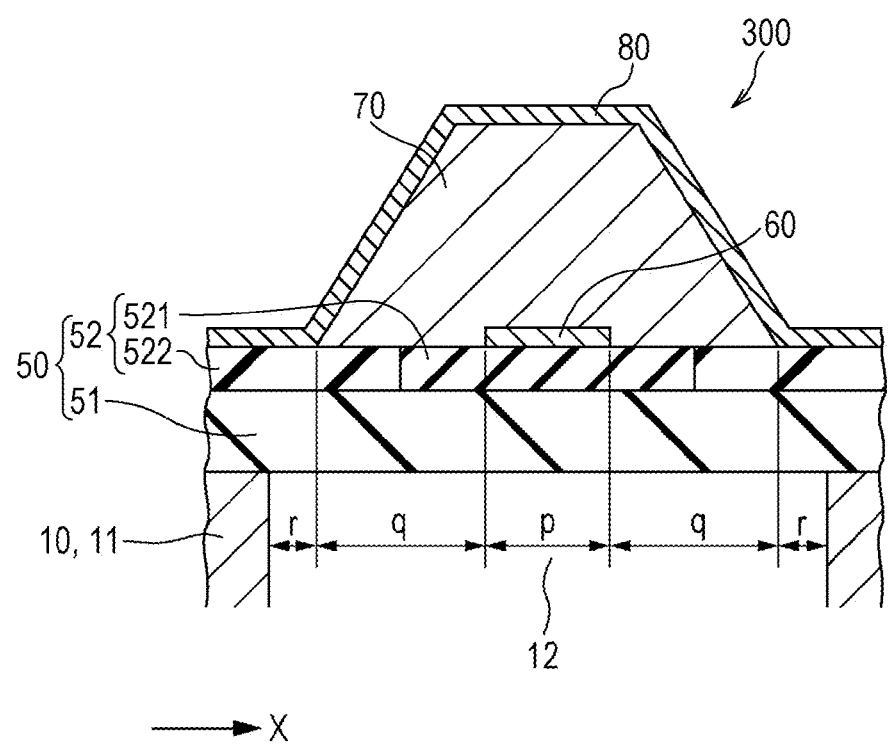

[Fig. 4A]
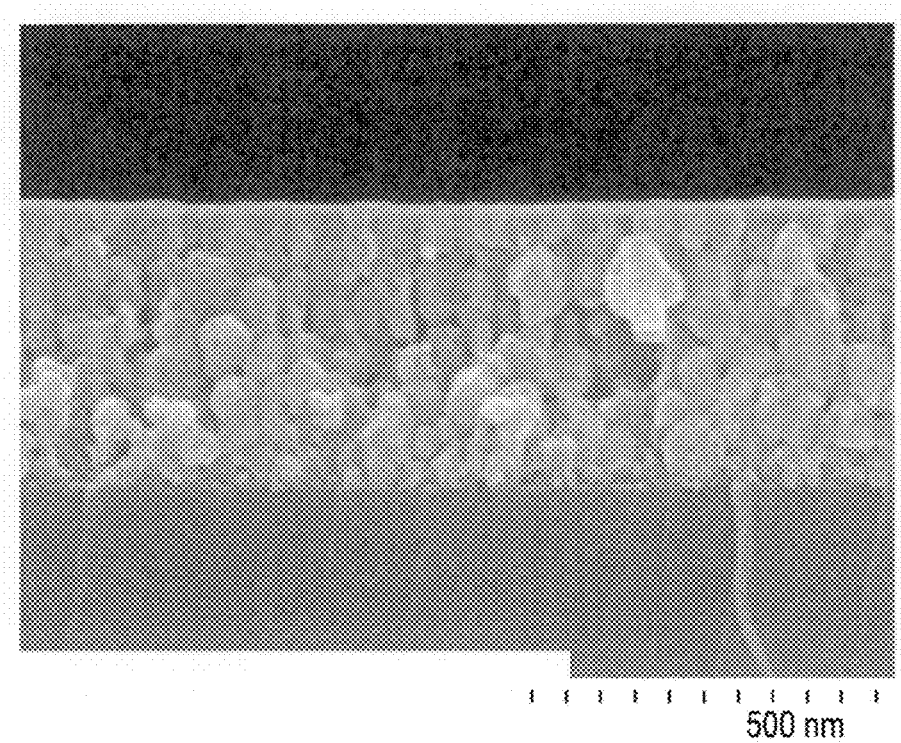
[Fig. 4B]
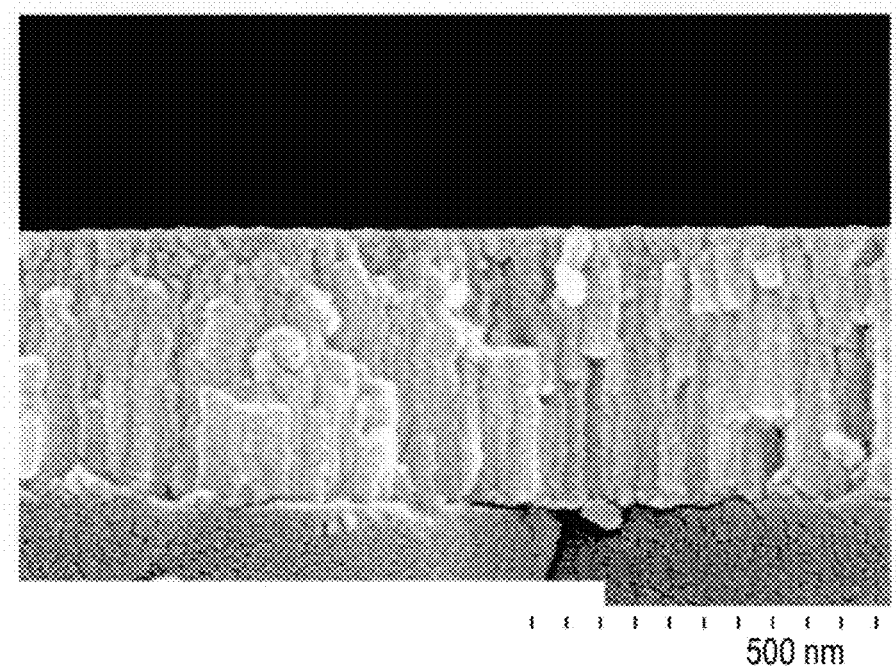

[Fig. 5A]
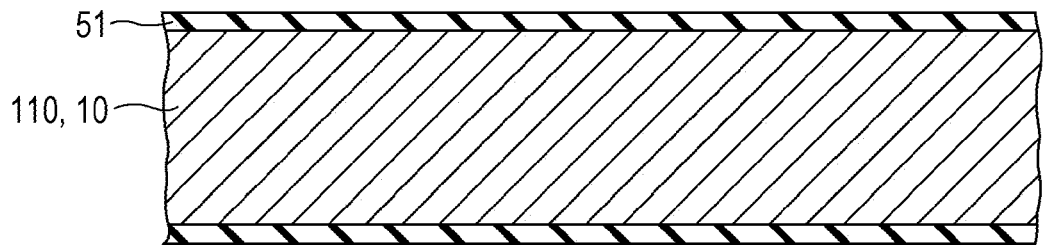
[Fig. 5B]
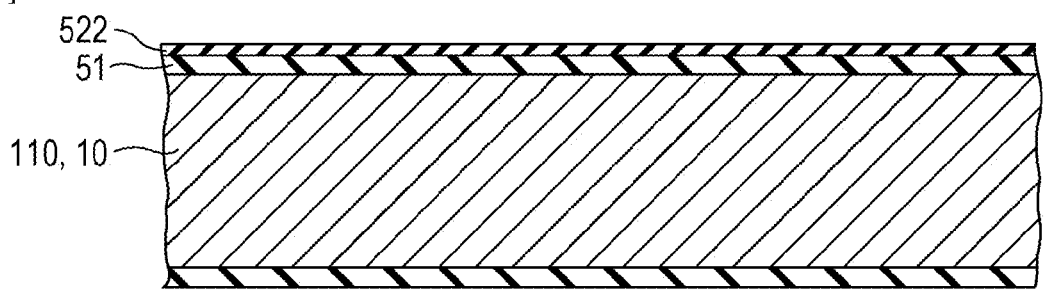
[Fig. 5C]
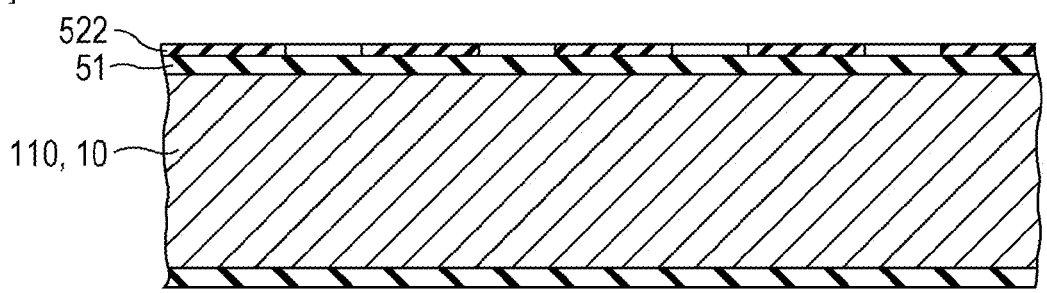
[Fig. 5D]
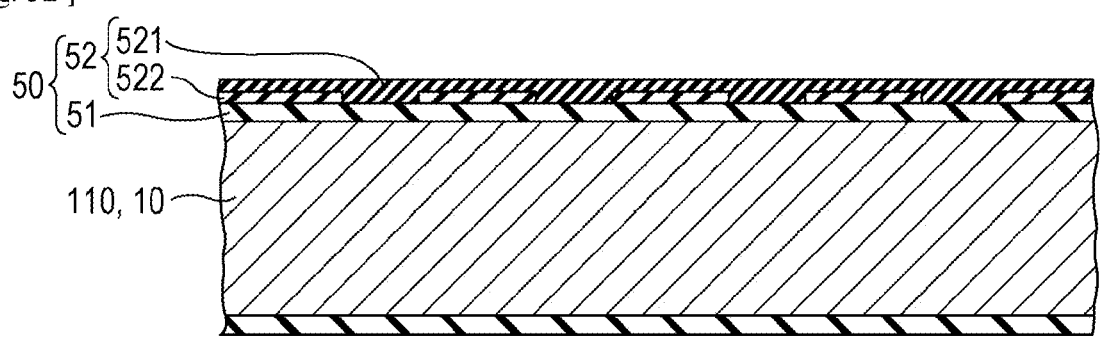
[Fig. 5E]
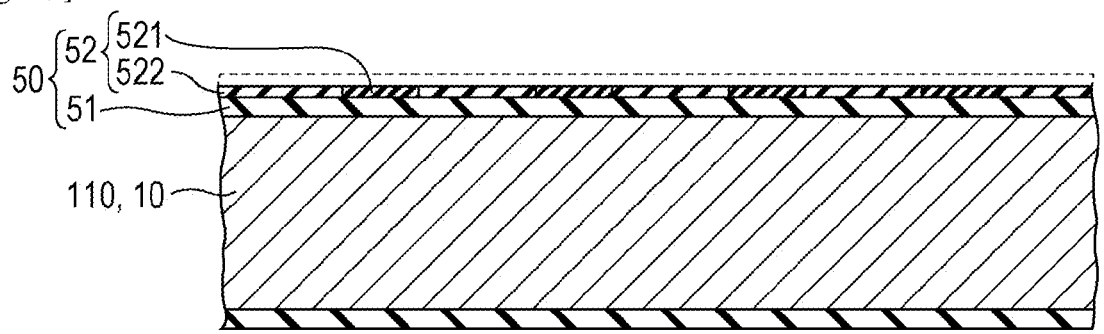

[Fig. 6A]
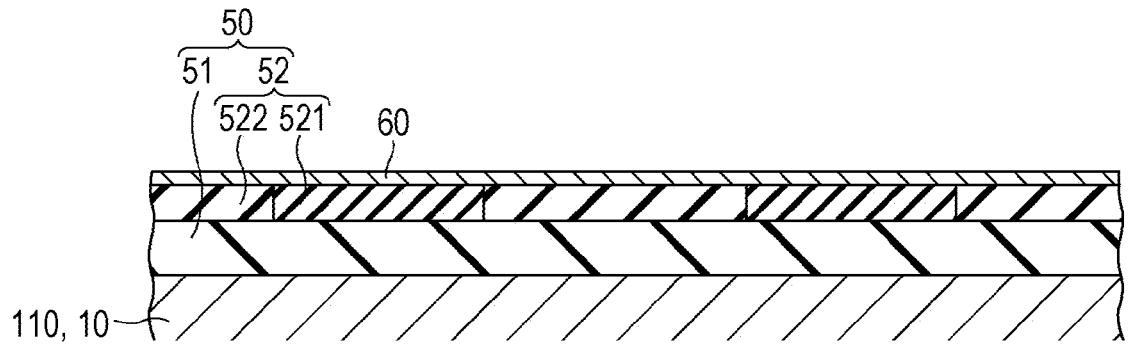
[Fig. 6B]
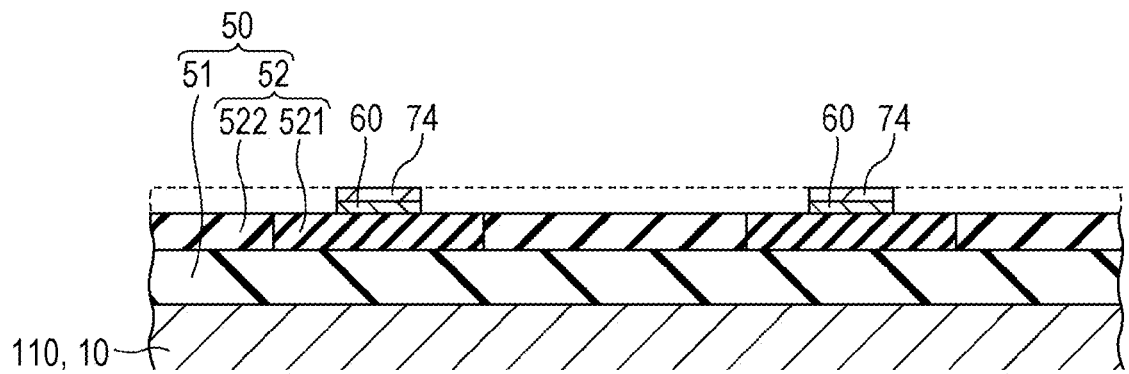
[Fig. 6C]
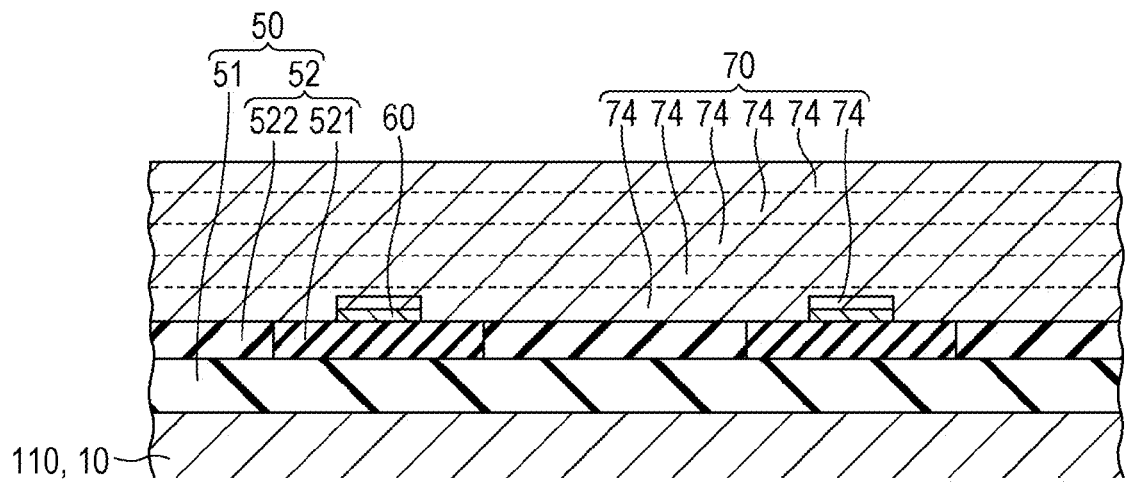

[Fig. 7A]
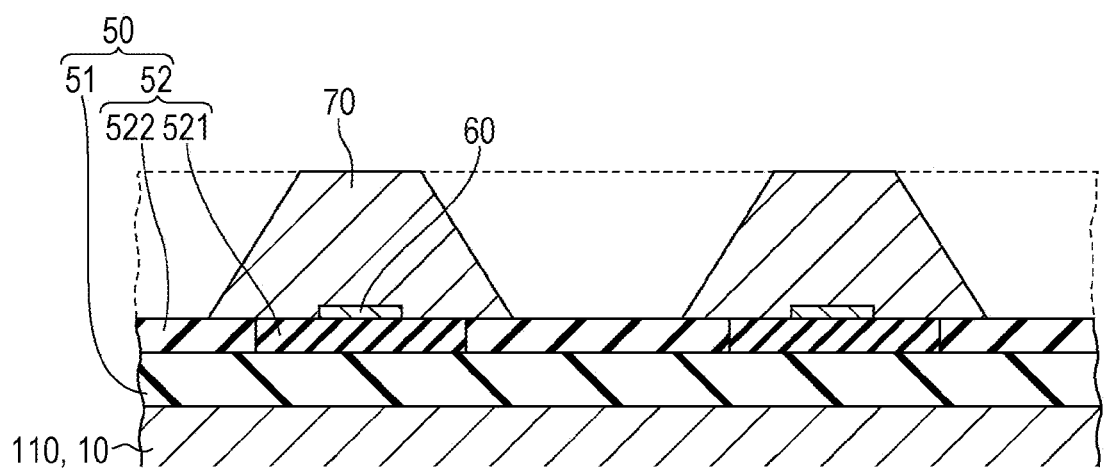
[Fig. 7B]
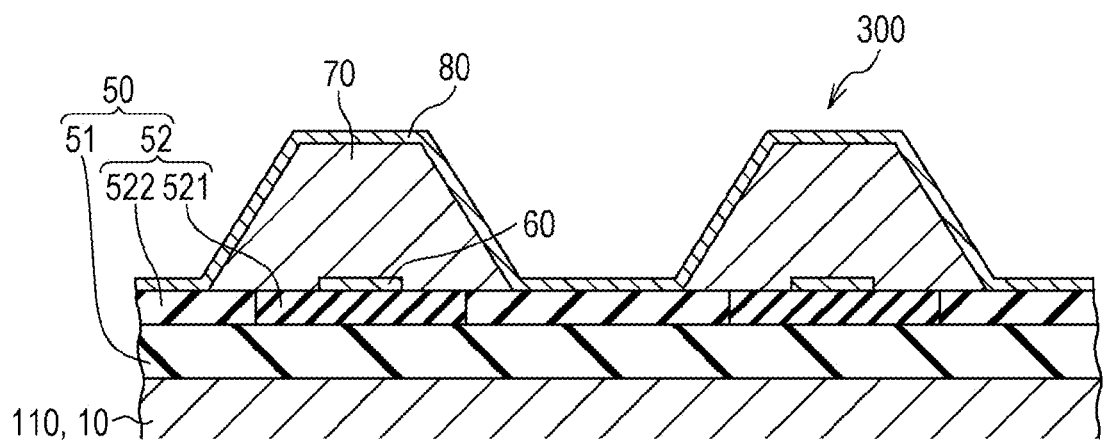

[Fig. 8A]
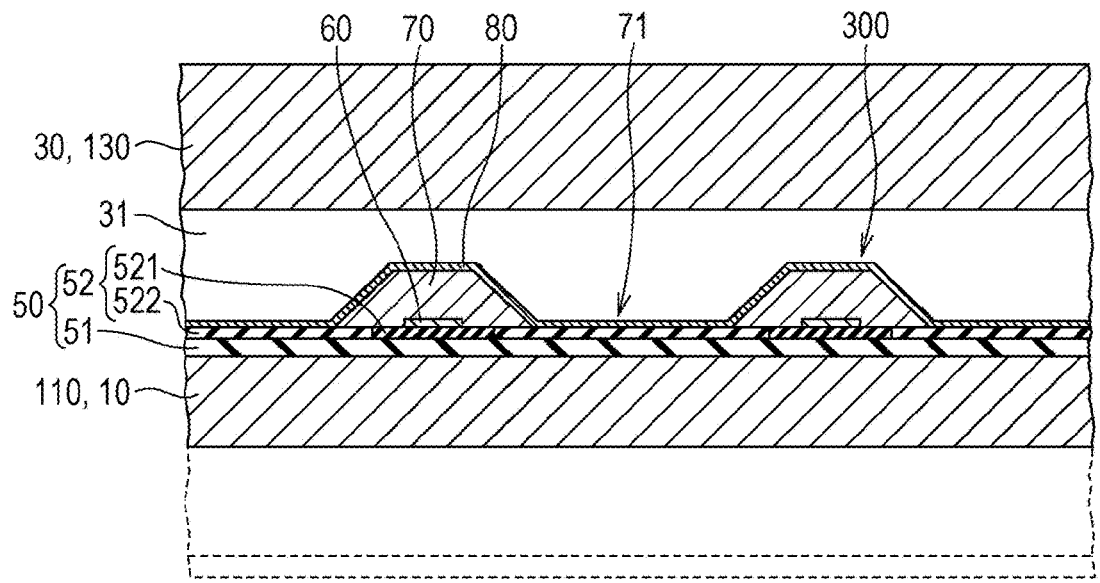
[Fig. 8B]
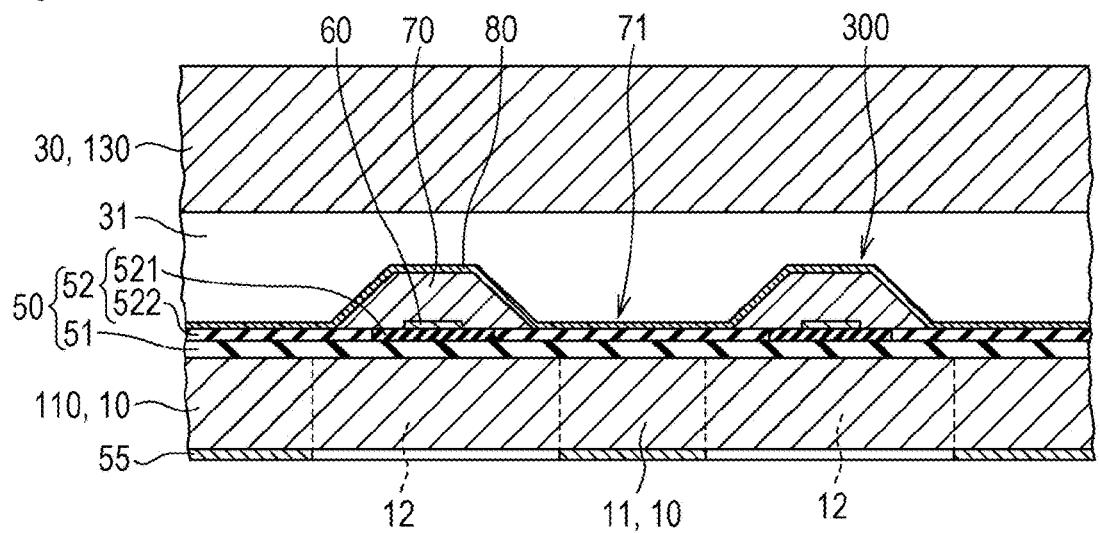
[Fig. 8C]
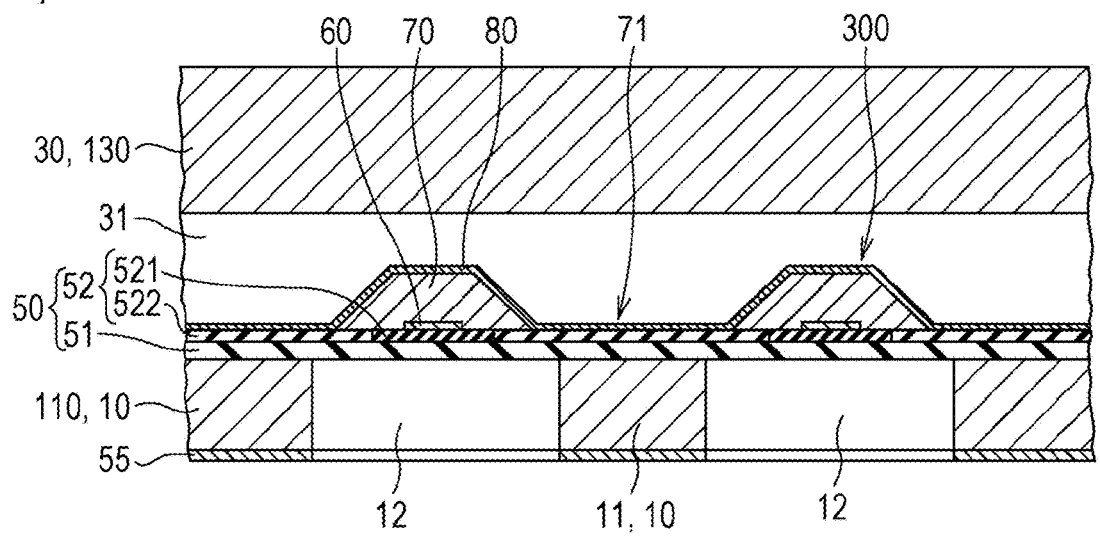

[Fig. 9]
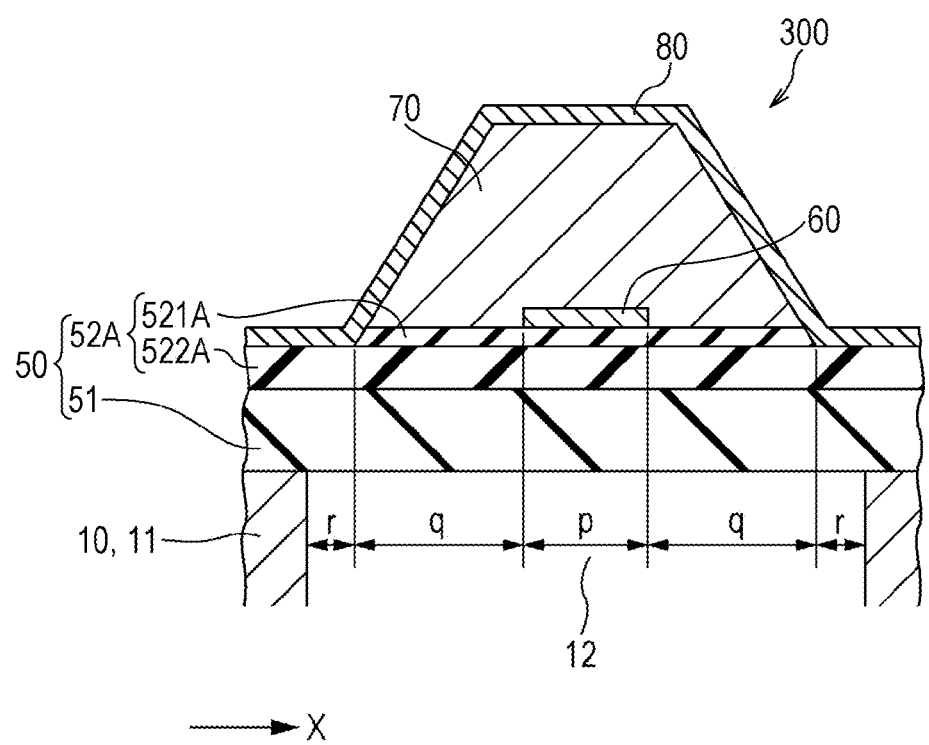

[Fig. 10A]
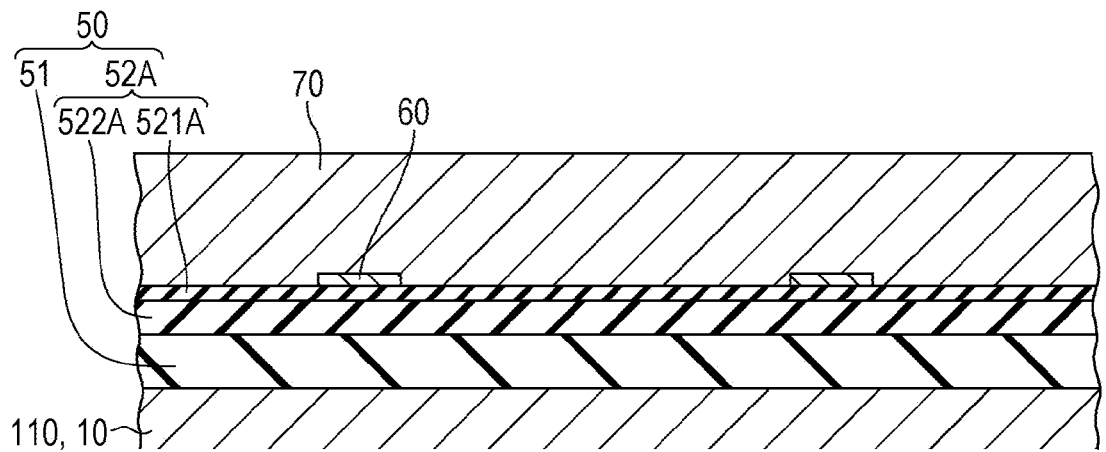
[Fig. 10B]
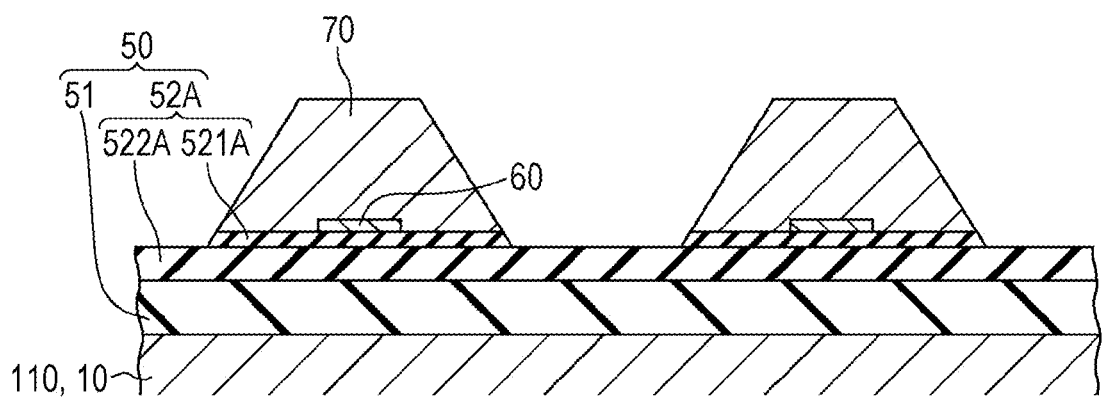

[Fig. 11]
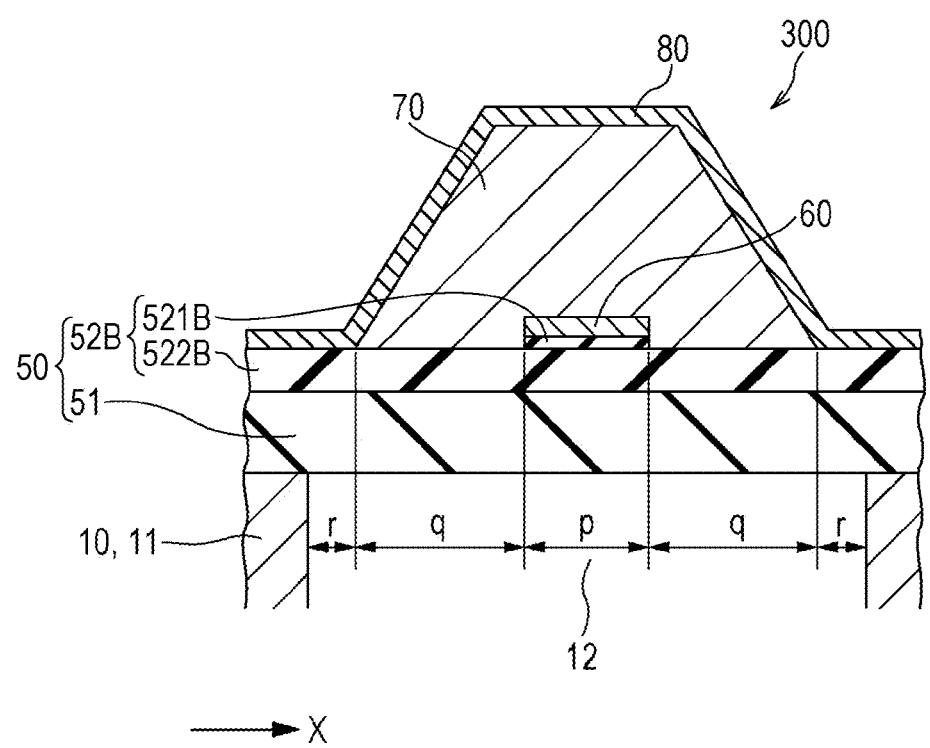

[Fig. 12A]
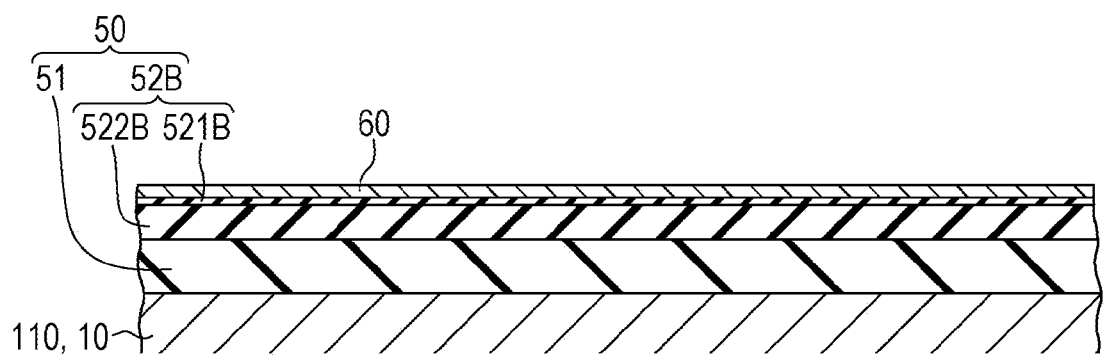
[Fig. 12B]
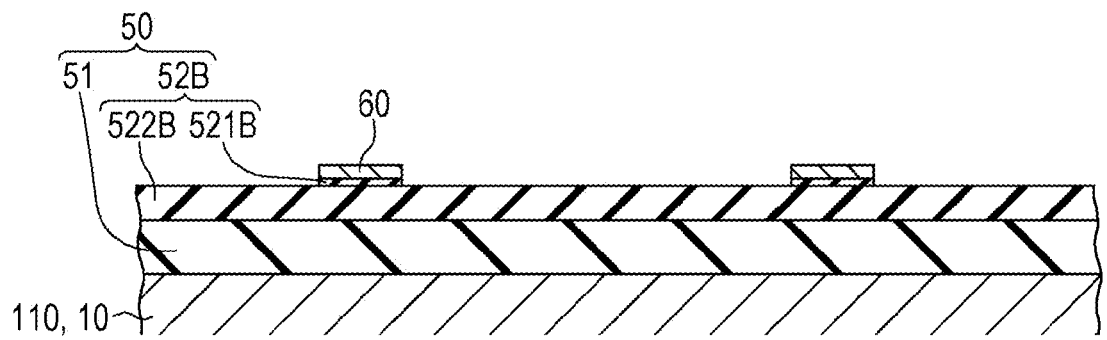

[Fig. 13]
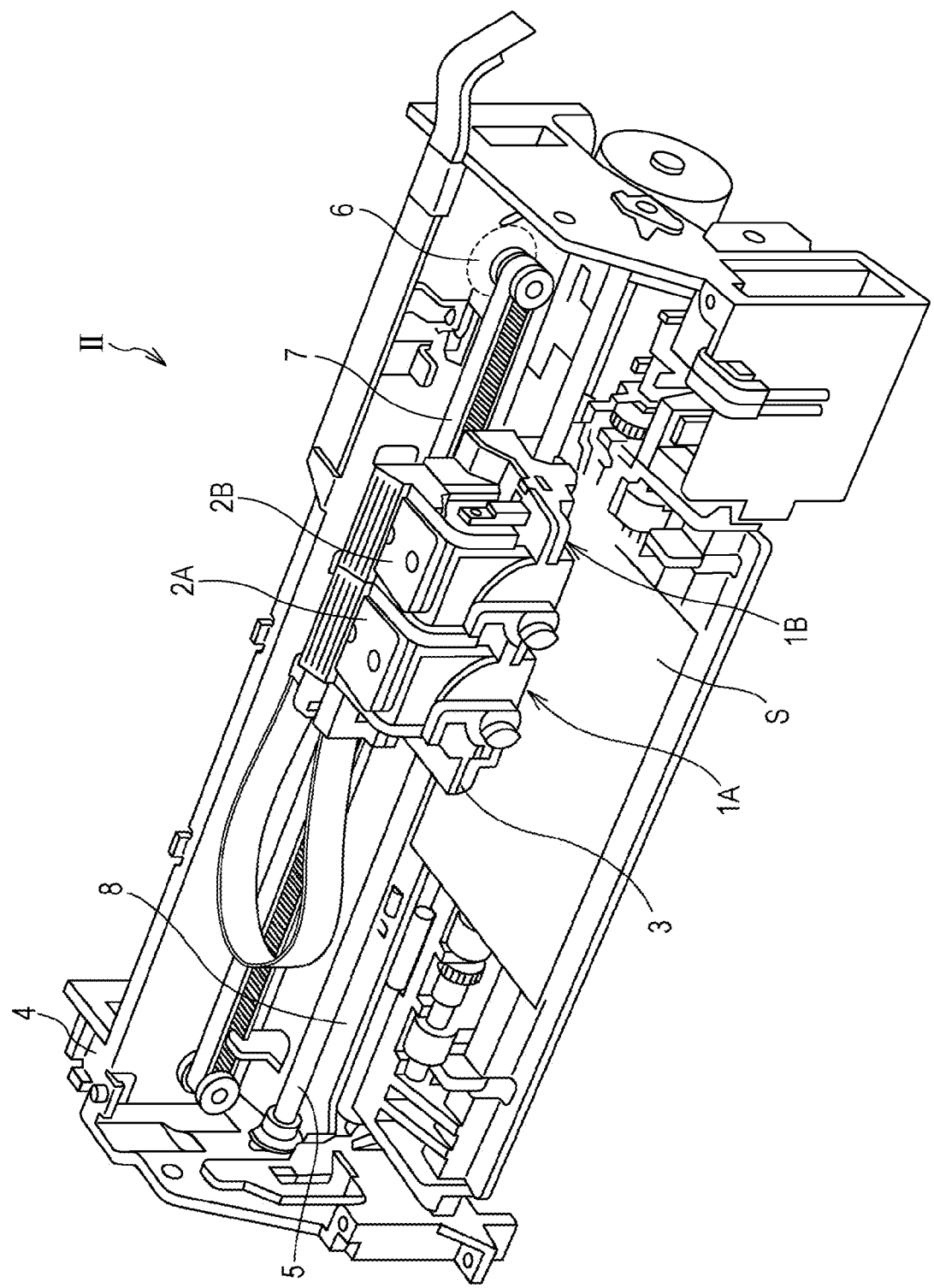

PIEZOELECTRIC DEVICE, LIQUID EJECTING HEAD, LIQUID EJECTING APPARATUS, AND MANUFACTURING METHOD OF PIEZOELECTRIC DEVICE

TECHNICAL FIELD

The present invention relates to a piezoelectric device including a piezoelectric element including a vibrating plate containing a zirconium oxide layer, a liquid ejecting head including a piezoelectric device, a liquid ejecting apparatus including a liquid ejecting head, and a manufacturing method of a piezoelectric device.

BACKGROUND ART

In a piezoelectric element used in a piezoelectric device, a ferroelectric layer formed of a piezoelectric material having an electromechanical conversion function, for example, a crystallized dielectric material is interposed between two electrodes, and a piezoelectric element including a zirconium oxide ($ZrO_2$) layer as a part of a vibrating plate has been known as such piezoelectric element.

A method of forming a zirconium oxide layer by forming a metal zirconium layer by using a sputtering method or the like and performing thermal oxidation of the metal zirconium layer has been proposed (for example, see PTL 1). In addition, particulate crystal particles are used, in order to obtain a zirconium oxide layer having excellent adhesiveness with a base layer or a first electrode of a vibrating plate (see PTLs 2 and 3).

CITATION LIST

Patent Literature

PTL 1: JP-A-2005-294438
PTL 2: JP-A-2013-202858
PTL 3: JP-A-2014-176985

SUMMARY OF INVENTION

Technical Problem

However, in recent years, a so-called piezoelectric element having high displacement efficiency which is capable of realizing great displacement with a low driving voltage is desired to be provided, but reliability thereof is not yet sufficient. This is not only a problem regarding adhesiveness between a zirconium oxide layer and a first electrode, but insufficient toughness of the zirconium oxide layer may also be a reason for the problem.

Such a problem does not only exist in a piezoelectric element used in a liquid ejecting head such as an ink jet type recording head, but also exists in a piezoelectric element used in other devices, in the same manner.

The invention is made in consideration of these circumstances and an object thereof is to provide a piezoelectric device including a piezoelectric element having improved reliability, a liquid ejecting head, a liquid ejecting apparatus, and a manufacturing method of a piezoelectric device.

Solution to Problem

According to an aspect of the invention for solving the aforementioned problems, there is provided a piezoelectric device including: a substrate on which a plurality of recesses are provided; a vibrating plate which is provided on one surface side of the substrate; and a piezoelectric element which is provided over the vibrating plate and on which a first electrode, a piezoelectric layer, and a second electrode are laminated from the substrate side, in which the first electrode is formed to have a first width which is smaller than a dimension of the recess in a parallel arrangement direction in the parallel arrangement direction of at least one recess, and the piezoelectric layer is extended to the outer side of the first electrode in the parallel arrangement direction and has a second width which is greater than the first width and smaller than a width of the recess in the parallel arrangement direction, the vibrating plate contains a zirconium oxide layer, and when an area of the zirconium oxide layer corresponding to the first electrode having the first width is set as a first area, areas of the zirconium oxide layer corresponding to areas where the piezoelectric layer is provided on the outer side of the first area in the parallel arrangement direction are set as second areas, and areas of the zirconium oxide layer corresponding to the recess on the outer side of the second areas in the parallel arrangement direction are set as third areas, the zirconium oxide layer contains particulate crystal in the first area at least on the first electrode side in the thickness direction and contains columnar crystal in the third areas.

In this case, a portion of the zirconium oxide layer contacted with the first electrode ensures adhesiveness as particulate crystal. Meanwhile, the third areas which are arms supporting the piezoelectric element when the piezoelectric element is deformed to the recess side ensure toughness as columnar crystal, and it is possible to obtain a piezoelectric device having higher reliability by preventing breakage and reduction of displacement.

Here, it is preferable that the zirconium oxide layer contains particulate crystal in the second areas. According to this, adhesiveness between the piezoelectric layer in the second areas and the zirconium oxide layer is improved, toughness is also improved, and accordingly, reliability is improved.

It is preferable that the zirconium oxide layer includes a first layer containing particulate crystal provided on the first electrode side in the thickness direction at least in the first area and a second layer containing columnar crystal provided on the substrate side. According to this, adhesiveness between the first electrode in the first area and the zirconium oxide layer is improved, toughness is also improved, and accordingly, reliability is improved.

It is preferable that a thickness of the zirconium oxide layer in the first area is greater than a thickness in the third area. According to this, the vibrating plate in a portion of the piezoelectric element is thick, the arms have a thin structure, and accordingly, the displacement efficiency is improved.

It is preferable that the zirconium oxide layer contains yttrium. According to this, toughness of the zirconium oxide layer is improved and reliability is further improved.

According to another aspect of the invention, there is provided a liquid ejecting head including: the piezoelectric device described above; and nozzle openings which communicate with the recess to eject liquid.

In this case, it is possible to realize a liquid ejecting head including a piezoelectric element having improved reliability.

According to still another aspect of the invention, there is provided a liquid ejecting apparatus including: the liquid ejecting head described above.

In this case, it is possible to realize a liquid ejecting apparatus including a piezoelectric element having improved reliability.

According to still another aspect of the invention, there is provided a manufacturing method of a piezoelectric device including a substrate on which a plurality of recesses are provided, a vibrating plate which is provided on one surface side of the substrate, and a piezoelectric element which is provided over the vibrating plate and on which a first electrode, a piezoelectric layer, and a second electrode are laminated from the substrate side, in which the first electrode is formed to have a first width which is smaller than a dimension of the recess in a parallel arrangement direction in the parallel arrangement direction of at least one recess, and the piezoelectric layer is extended to the outer side of the first electrode in the parallel arrangement direction and has a second width which is greater than the first width and smaller than a width of the recess in the parallel arrangement direction, the vibrating plate contains a zirconium oxide layer, and when an area of the zirconium oxide layer corresponding to the first electrode having the first width is set as a first area, areas of the zirconium oxide layer corresponding to areas where the piezoelectric layer is provided on the outer side of the first area in the parallel arrangement direction are set as second areas, and areas of the zirconium oxide layer corresponding to the recess on the outer side of the second areas in the parallel arrangement direction are set as third areas, the zirconium oxide layer contains particulate crystal in the first area at least on the first electrode side in the thickness direction and contains columnar crystal in the third areas, the method including: forming a portion of the zirconium oxide layer containing particulate crystal by using a liquid phase method; and forming a portion of the zirconium oxide layer containing columnar crystal by oxidizing the zirconium layer formed by using a gas phase method.

In this case, a portion of the zirconium oxide layer contacted with the first electrode ensures adhesiveness as particulate crystal. Meanwhile, the third areas which are arms supporting the piezoelectric element when the piezoelectric element is deformed to the recess side ensure toughness as columnar crystal, and it is possible to manufacture a piezoelectric device having higher reliability by preventing breakage and reduction of displacement.

BRIEF DESCRIPTION OF DRAWINGS

FIG. 1 shows an exploded perspective view of a recording head according to Embodiment 1 of the invention.

FIG. 2A shows a plan view of the recording head according to Embodiment 1 of the invention.

FIG. 2B shows a sectional view of the recording head according to Embodiment 1 of the invention.

FIG. 3 shows an enlarged sectional view of a main part of the recording head according to Embodiment 1 of the invention.

FIG. 4A shows an SEM image of zirconium oxide according to Embodiment 1 of the invention.

FIG. 4B shows an SEM image of zirconium oxide according to Embodiment 1 of the invention.

FIG. 5A shows a sectional view showing a manufacturing method of the recording head according to Embodiment 1 of the invention.

FIG. 5B shows a sectional view showing a manufacturing method of the recording head according to Embodiment 1 of the invention.

FIG. 5C shows a sectional view showing a manufacturing method of the recording head according to Embodiment 1 of the invention.

FIG. 5D shows a sectional view showing a manufacturing method of the recording head according to Embodiment 1 of the invention.

FIG. 5E shows a sectional view showing a manufacturing method of the recording head according to Embodiment 1 of the invention.

FIG. 6A shows a sectional view showing the manufacturing method of the recording head according to Embodiment 1 of the invention.

FIG. 6B shows a sectional view showing the manufacturing method of the recording head according to Embodiment 1 of the invention.

FIG. 6C shows a sectional view showing the manufacturing method of the recording head according to Embodiment 1 of the invention.

FIG. 7A shows a sectional view showing the manufacturing method of the recording head according to Embodiment 1 of the invention.

FIG. 7B shows a sectional view showing the manufacturing method of the recording head according to Embodiment 1 of the invention.

FIG. 8A shows a sectional view showing the manufacturing method of the recording head according to Embodiment 1 of the invention.

FIG. 8B shows a sectional view showing the manufacturing method of the recording head according to Embodiment 1 of the invention.

FIG. 8C shows a sectional view showing the manufacturing method of the recording head according to Embodiment 1 of the invention.

FIG. 9 is a sectional view of a recording head according to Embodiment 2 of the invention.

FIG. 10A shows a sectional view showing a manufacturing method of the recording head according to Embodiment 2 of the invention.

FIG. 10B shows a sectional view showing a manufacturing method of the recording head according to Embodiment 2 of the invention.

FIG. 11 is a sectional view of a recording head according to Embodiment 3 of the invention.

FIG. 12A shows a sectional view showing a manufacturing method of the recording head according to Embodiment 3 of the invention.

FIG. 12B shows a sectional view showing a manufacturing method of the recording head according to Embodiment 3 of the invention.

FIG. 13 is a schematic view of a recording apparatus according to one embodiment of the invention.

DESCRIPTION OF EMBODIMENTS

Hereinafter, the invention will be described in detail based on embodiments.

Embodiment 1

FIG. 1 is a perspective view of an ink jet type recording head which is an example of a liquid ejecting head according to Embodiment 1 of the invention, FIG. 2A is a plan view of the ink jet type recording head, FIG. 2B is a sectional view taken along a line IIB-IIB of FIG. 2A, and FIG. 3 is an enlarged sectional view of a main part in a first direction X.

As shown in the drawings, a pressure generation chambers 12, as recesses, are formed in a flow path formation substrate 10 included in an ink jet type recording head I which is an example of the liquid ejecting head of this embodiment. The pressure generation chambers 12 partitioned by a plurality of partition walls 11 are arranged in parallel in a direction in which a plurality of nozzle openings 21 discharging ink having the same color are arranged in parallel. Hereinafter, this direction is referred to as a parallel arrangement direction of the pressure generation chambers 12 or a first direction X. The pressure generation chambers 12 are arranged in parallel in the first direction X on the flow path formation substrate 10 to have a plurality of columns, in this embodiment, two columns. A column arrangement direction in which the plurality of columns of the pressure generation chambers 12 in which the pressure generation chambers 12 are formed along the first direction X are arranged is, hereinafter, referred to as a second direction Y. In addition, a direction orthogonal to both of the first direction X and the second direction Y is, hereinafter, referred to as a third direction Z.

Ink supply paths 13 and communication paths 14 are partitioned by the plurality of partition walls 11 on one end side of the pressure generation chambers 12 of the flow path formation substrate 10 in a longitudinal direction, that is, on one end side in the second direction Y orthogonal to the first direction X. A communication portion 15 configuring a part of a manifold 100 which is a common ink chamber (liquid chamber) of the pressure generation chambers 12 is formed on an outer side of the communication paths 14 (on a side opposite to the pressure generation chambers 12 in the second direction Y). That is, liquid flow paths formed of the pressure generation chambers 12, the ink supply paths 13, the communication paths 14, and the communication portion 15 are provided in the flow path formation substrate 10.

A nozzle plate 20 on which nozzle openings 21 communicating with the pressure generation chambers 12 are penetrated is bonded to one surface side of the flow path formation substrate 10, that is, a surface to which the liquid flow paths of the pressure generation chambers 12 and the like are opened, by using an adhesive or a heat welding film. That is, the nozzle openings 21 are arranged in parallel in the first direction X in the nozzle plate 20.

A vibrating plate 50 is formed on a side of the other surface of the flow path formation substrate 10. As shown in FIG. 3, the vibrating plate 50 according to this embodiment includes an oxide layer 51 formed of oxide formed on the flow path formation substrate 10 and a zirconium oxide layer 52 formed of zirconium oxide ($ZrO_2$) formed on the oxide layer 51 by using a liquid phase method.

As the oxide layer 51, silicon dioxide ($SiO_2$) or silicon nitride ($Si_3N_4$) may be used, for example. In this embodiment, the liquid flow paths of the pressure generation chambers 12 and the like are formed by performing anisotropic etching of the flow path formation substrate 10 from one surface thereof, and the other surface of the liquid flow paths of the pressure generation chamber 12 and the like is configured with the oxide layer 51. Accordingly, it is necessary that the flow path formation substrate 10 side of the vibrating plate 50 withstands a temperature (generally, equal to or higher than 500° C.) when forming a piezoelectric layer 70, and in a case of using anisotropic etching with KOH (potassium hydroxide) when forming flow paths such as the pressure generation chambers 12 and the like using a silicon wafer as the flow path formation substrate 10, it is necessary that the vibrating plate (in a case of a laminate, silicon wafer side) functions as an etching stop layer. Therefore, the oxide layer 51 which is silicon oxide is preferably provided, but the zirconium oxide layer 52 may be directly provided on the flow path formation substrate 10, without providing the oxide layer 51, depending on the shape or manufacturing method of the flow paths.

First electrodes 60, a piezoelectric layer 70, and second electrodes 80 are formed on the vibrating plate 50. In this embodiment, a piezoelectric element 300 is configured with the vibrating plate 50, the first electrodes 60, the piezoelectric layer 70, and the second electrodes 80. The piezoelectric element 300 provided on this substrate (flow path formation substrate 10) to be deformable is a piezoelectric actuator of this embodiment.

Here, the first electrodes 60 configuring the piezoelectric element 300 are divided for each pressure generation chamber 12 and configure an individual electrode which is electrically independent for each active portion which will be described later. The first electrodes 60 are formed to have a narrower width (corresponding to a first width) than a width of the pressure generation chamber 12 in the first direction X of the pressure generation chamber 12. That is, the end of the first electrode 60 in the first direction X of the pressure generation chamber 12 is positioned in an area opposing the pressure generation chamber 12. Both ends of the first electrode 60 in the second direction Y are extended to the outside of each pressure generation chamber 12. As a material of the first electrodes 60, a material which is not oxidized when forming the piezoelectric layer 70 which will be described later or maintains conductivity even when being oxidized is necessarily used, and for example, noble metal such as platinum (Pt) or iridium (Ir), or conductive oxide represented by lanthanum nickel oxide (LNO) is preferably used.

As the first electrodes 60, an adhesive layer for ensuring adhesiveness may be used between the conductive material described above and the vibrating plate 50. In this embodiment, although not particularly shown, titanium is used as the adhesive layer. As the adhesive layer, zirconium, titanium, or titanium oxide may be used. That is, in this embodiment, the first electrodes 60 are formed with the adhesive layer formed of titanium and a conductive layer which is formed of at least one kind selected from the conductive materials described above.

The piezoelectric layer 70 is continuously provided along the first direction X, so as to have a predetermined width in the second direction Y. The width of the piezoelectric layer 70 in the second direction Y is wider than a length of the pressure generation chamber 12 in the second direction Y. Accordingly, in the second direction Y of the pressure generation chamber 12, the piezoelectric layer 70 is provided to extend to the outside of the pressure generation chamber 12.

An end of the piezoelectric layer 70 on one end side (in this embodiment, ink supply path side) of the pressure generation chamber 12 in the second direction Y is positioned on an outer side with respect to the end of the first electrode 60. That is, the end of the first electrode 60 is covered with the piezoelectric layer 70. An end of the piezoelectric layer 70 on the other end side of the pressure generation chamber 12 in the second direction Y is positioned on an inner side (pressure generation chamber 12 side) with respect to the end of the first electrode 60.

Lead electrodes 90 formed of gold (Au) are, for example, connected to the first electrodes 60 extended to the outer side of the piezoelectric layer 70. Although not shown, the lead electrode 90 configures a terminal portion which is connected to a connection wire connected to a driving circuit or the like.

Recesses 71 opposing partition walls 11 are formed on the piezoelectric layer 70. A width of the recess 71 in the first direction X is substantially the same as or wider than the width of each partition wall 11 in the first direction X. Accordingly, the piezoelectric layer 70 is divided to have a width (corresponding to a second width) so that the width in the first direction is smaller than the width of the pressure generation chamber 12 and an increase in rigidity of a portion of the vibrating plate 50 opposing the end of the pressure generation chamber 12 in the width direction (so-called arm of the vibrating plate 50) is prevented, and thus, it is possible to excellently displace the piezoelectric element 300.

As the piezoelectric layer 70, a crystal film (perovskite type crystal) which is formed over the first electrodes 60 and has a perovskite structure formed of a ferroelectric ceramic material showing an electromechanical transduction operation is used. As the material of the piezoelectric layer 70, a material containing lead (Pb), titanium (Ti), and zirconium (Zr), for example, a ferroelectric piezoelectric material such as lead zirconate titanate (PZT) or a material obtained by adding metal oxide such as niobium oxide, nickel oxide, or magnesium oxide to the ferroelectric piezoelectric material may be used. Specific examples thereof may include lead titanate ($PbTiO_3$), lead zirconate titanate ($Pb(Zr,Ti)O_3$), lead zirconate ($PbZrO_3$), lead lanthanum titanate ($(Pb,La)TiO_3$), lead lanthanum zirconate titanate ($(Pb,La)(Zr,Ti)O_3$), and magnesium niobate zirconium titanate ($Pb(Zr,Ti)(Mg,Nb)O_3$). In this embodiment, lead zirconate titanate (PZT) is used as the piezoelectric layer 70.

In addition, as the material of the piezoelectric layer 70, a lead-free piezoelectric material not containing lead, for example, a composite oxide having a perovskite structure containing bismuth ferrate or bismuth manganate ferrate and barium titanate or bismuth potassium titanate may be used.

As will be described later in detail, the piezoelectric layer 70 may be formed by using a liquid phase method such as a sol-gel method or a metal-organic decomposition (MOD) method, or a physical vapor deposition (PVD) method (gas phase method) such as a sputtering method or a laser ablation method. In this embodiment, the internal stress when forming the piezoelectric layer 70 is tensile stress.

The second electrode 80 is provided on a side of the piezoelectric layer 70 opposite to the first electrodes 60 and configures a common electrode which is used for all of a plurality of active portions 310.

As the second electrode 80, a material capable of excellently forming a boundary surface with the piezoelectric layer 70 and exhibiting insulating properties and piezoelectric characteristics is desirable, and a noble metal material such as iridium (Ir), platinum (Pt), palladium (Pd), or gold (Au), or conductive oxide represented by lanthanum nickel oxide (LNO) may be used. The second electrode 80 may be a laminate of a plurality of materials. In addition, the second electrode 80 may be formed by using a physical vapor deposition (PVD) method (gas phase method) such as a sputtering method or a laser ablation method, or a liquid phase method such as a sol-gel method, a metal-organic decomposition (MOD) method, or a plating method.

The second electrode 80 is continuously provided on the surface of the piezoelectric layer 70 on a side opposite to the first electrode 60, the inner surface of the recess 71, that is, the side surface of the piezoelectric layer 70, and the vibrating plate 50.

The end of the second electrode 80 in one end side (ink supply path side) of the pressure generation chamber 12 in the second direction Y is positioned on an inner side (pressure generation chamber 12 side) with respect to the end of the piezoelectric layer 70. That is, the end of the piezoelectric layer 70 in the second direction is provided to protrude to the outer side with respect to the second electrode 80.

The piezoelectric element 300 having such configurations is displaced by applying a voltage between the first electrode 60 and the second electrode 80. That is, by applying a voltage between both electrodes, piezoelectric strain is generated on the piezoelectric layer 70 which is narrowed by the first electrode 60 and the second electrode 80. When the voltage is applied between both electrodes, a portion on which the piezoelectric strain is generated on the piezoelectric layer 70 is called the active portion 310. Meanwhile, a portion on which the piezoelectric strain is not generated on the piezoelectric layer 70 is called a non-active portion. In the active portion 310 on which the piezoelectric strain is generated on the piezoelectric layer 70, a portion opposing the pressure generation chamber 12 is called a flexible portion and a portion outside of the pressure generation chamber 12 is called a non-flexible portion.

In this embodiment, all of the first electrode 60, the piezoelectric layer 70, and the second electrode 80 are continuously provided to the outside of the pressure generation chamber 12 in the second direction Y of the pressure generation chamber 12. That is, the active portion 310 is continuously provided to the outside of the pressure generation chamber 12. Accordingly, among the active portion 310, a portion of the piezoelectric element 300 opposing the pressure generation chamber 12 is the flexible portion and a portion thereof outside of the pressure generation chamber 12 is the non-flexible portion.

Here, in this embodiment, as shown in FIGS. 2A and 2B, the end of the active portion 310 in the second direction Y is regulated by the second electrode 80 and the end of the active portion 310 in the second direction Y is provided in the outside of an area opposing the pressure generation chamber 12, that is, a non-active portion.

The non-active portion where the second electrode 80 is not provided is disposed on the outer side of the active portion 310 in the second direction Y, in this embodiment, on a side opposite to the ink supply path 13.

In the piezoelectric element 300, since the second electrode 80 covers the piezoelectric layer 70, it is possible to prevent breakage of the piezoelectric element 300 without leakage of current between the first electrode 60 and the second electrode 80. In addition, when the first electrode 60 and the second electrode 80 are exposed in an approached state, the current leaks to the surface of the piezoelectric layer 70 and the piezoelectric layer 70 is broken. If a distance between these is short, leakage of current does not occur, although the first electrode 60 and the second electrode 80 are exposed.

As shown in FIG. 1 and FIGS. 2A and 2B, a protection substrate 30 which protects the piezoelectric element 300 is bonded onto the flow path formation substrate 10 on which the piezoelectric element 300 is formed by using adhesive 35.

A piezoelectric element holding portion 31 which is a recess for partitioning a space for accommodating the piezoelectric element 300 is provided on the protection substrate 30. A manifold portion 32 configuring a part of the manifold 100 is provided on the protection substrate 30. The manifold portion 32 penetrates the protection substrate 30 in the thickness direction to form along a width direction of the pressure generation chamber 12, and communicates with the communication portion 15 of the flow path formation substrate 10 as described above. In addition, a penetration hole 33 which penetrates through the protection substrate 30 in the thickness direction is provided on the protection substrate 30. The lead electrode 90 connected to the first electrode 60 of each active portion 310 is exposed in the penetration hole 33, and one end of a connection wire connected to a driving circuit (not shown) is connected to the lead electrode 90 in the penetration hole 33.

A compliance substrate 40 formed of a sealing film 41 and a fixed plate 42 is bonded to the protection substrate 30. The sealing film 41 is formed of a flexible material having low rigidity, and one surface of the manifold portion 32 is sealed with this sealing film 41. In addition, the fixed plate 42 is formed of a hard material such as metal or the like. Since the area of the fixed plate 42 opposing the manifold 100 is set to an opening portion 43 which is completely removed in the thickness direction, one surface of the manifold 100 is sealed only with the sealing film 41 having flexibility.

In the ink jet type recording head I of the embodiment, the ink is introduced from an ink introduction port which is connected to an external ink supply unit (not shown), and the inside from the manifold 100 to the nozzle opening 21 is filled with the ink. After that, a voltage is applied between the first electrode 60 and the second electrode 80 corresponding to the pressure generation chamber 12 according to a recording signal from the driving circuit. Accordingly, the vibrating plate 50 is deformed together with the piezoelectric element 300, the pressure in each pressure generation chamber 12 is increased, and ink droplets are ejected from each nozzle opening 21.

Here, the zirconium oxide layer 52 of this embodiment will be described in detail. FIG. 3 is a sectional view taken along the first direction X which is a parallel arrangement direction of the pressure generation chamber 12. In FIG. 3, an area corresponding to the width of the first electrode 60 is set as a first area p, areas where the piezoelectric layer 70 is present on both sides of the first area p in the first direction X is set as second areas q, and areas corresponding to the pressure generation chamber 12 on both sides of the second areas q in the first direction X are set as third areas r.

The zirconium oxide layer 52 is formed of a zirconium oxide layer 521 having particulate crystal, and a zirconium oxide layer 522 having columnar or substantially columnar crystal (in this specification, both are collectively referred to as columnar crystal). The zirconium oxide layer 521 having particulate crystal is formed of zirconium oxide ($ZrO_2$) formed by using a liquid phase method such as a sol-gel method or a metal-organic decomposition (MOD) method, and the zirconium oxide layer is present in the first area p and the middle portions of the second areas q on both sides thereof. Meanwhile, the zirconium oxide layer 522 having columnar crystal is formed of zirconium oxide ($ZrO_2$) formed by using a gas phase method such as a sputtering method or a chemical vapor deposition method (CVD method), and the zirconium oxide layer is present in the remaining second areas q and the third areas r on the outer side of the zirconium oxide layer 521 in the first direction X and is also extended to the outer side of the third areas r.

Here, surface roughness of the zirconium oxide layer 521 having particulate crystal is greater than columnar crystal, in a case of comparing the surface roughness thereof with that of the zirconium oxide layer 522 containing columnar crystal, and accordingly, adhesiveness with the base (oxide layer 51) or the first electrode 60 and the piezoelectric layer 70 provided thereon is improved. Meanwhile, toughness of the zirconium oxide layer 522 containing columnar crystal is higher than that of the zirconium oxide layer 521, withstands repeated deformation and has excellent durability.

The method of the formation of the zirconium oxide layer 521 having particulate crystal is not limited to the liquid phase method and the zirconium oxide layer 521 may be formed by using the gas phase method, and the method of the formation of the zirconium oxide layer 522 having columnar crystal is not limited to the gas phase method and the zirconium oxide layer 522 may be formed by using the liquid phase method.

As described above, in the piezoelectric device of this embodiment, a portion of the zirconium oxide layer 52 contacted with the first electrode ensures adhesiveness as particulate crystal. Meanwhile, the third areas r which are arms supporting the piezoelectric element when the piezoelectric element is deformed to the recess side ensure toughness as columnar crystal, and it is possible to obtain a piezoelectric device having higher reliability by preventing breakage and reduction of displacement. Here, since the zirconium oxide layer 521 having particulate crystal is continuously provided from the first area p which is an area corresponding to the first electrode 60 to some parts of the second areas q on the outer side thereof, adhesiveness with the first electrode 60 is reliably ensured and adhesiveness with a boundary portion between the piezoelectric layer 70 and the first electrode 60 is ensured. Since the third areas r corresponding to the arms of the piezoelectric element are only formed of the zirconium oxide layer 522 having columnar crystal and the zirconium oxide layer 522 is continuously extended from the second areas q on the inner side of the third areas r, toughness of the arms is reliably improved, breakage and displacement failure are more reliably prevented, and reliability is improved.

The piezoelectric layer 70 formed on the zirconium oxide layer 521 having particulate crystal has a greater orientation rate of the (100) plane, compared to a case where the piezoelectric layer is formed on the zirconium oxide layer 522 having columnar crystal. This is because the value of the orientation rate depends on a degree of the surface roughness of the zirconium oxide layer 521. Accordingly, the deformation efficiency of the piezoelectric element 300 is further improved.

Here, FIGS. 4A and 4B show results obtained by observing the surfaces of zirconium oxide formed by the liquid phase method and zirconium oxide formed by the gas phase method by using a scanning electron microscope (SEM).

As shown in FIG. 4A, zirconium oxide formed by the liquid phase method is particulate crystal. With respect to this, as shown in FIG. 4B, zirconium oxide formed by the gas phase method is columnar crystal formed from the base side towards the piezoelectric layer side.

Here, a manufacturing method of the ink jet type recording head of the embodiment will be described. FIG. 5A to FIG. 8C are sectional views showing the manufacturing method of the ink jet type recording head.

First, the vibrating plate 50 is formed on a surface of a flow path formation substrate wafer 110 which is a silicon wafer. Specifically, as shown in FIG. 5A, the oxide layer 51 formed of silicon dioxide is formed by performing thermal oxidation of the flow path formation substrate wafer 110.

Next, as shown in FIG. 5B, the zirconium oxide layer 522 formed of zirconium oxide ($ZrO_x$) having columnar crystal is formed on the oxide layer 51 by sputtering. For example, a film of zirconium (Zr) is formed by sputtering, and then, heat treatment, for example, annealing at 900° C. is performed, and accordingly, columnar $ZrO_2$ may be formed. A film thickness of $ZrO_2$ may be set as 200 nm, for example.

Next, as shown in FIG. 5C, the zirconium oxide layer 522 is patterned and the zirconium oxide layer 522 in the first area p and the areas corresponding to some parts of the second areas q is removed. This patterning may be performed by a well-known dry etching or ion milling.

Next, as shown in FIG. 5D, the zirconium oxide layer 521 formed of zirconium oxide ($ZrO_x$) having particulate crystal is formed on the patterned zirconium oxide layer 522 by the liquid phase method.

More specifically, first, metal alkoxide or metal carboxylate and a thickening agent are added to carboxylic acid, then water ($H_2O$) is added thereto, a mixture is heated and stirred at 70° C. for approximately 2 hours, and an evenly transparent precursor solution is obtained. This precursor solution is applied to a substrate at a rotation rate of 1400 rpm by a spin coating method (application step). Then, the solution applied to the substrate is heated at 160° C. to 200° C. and dried for approximately 5 minutes, and a dried film is obtained (drying step). This dried film is heated at 375° C. to 415° C. and held for approximately 5 minutes to perform degreasing (degreasing step). The degreasing herein is degreasing of an organic component contained in the fried film as $NO_2$, $CO_2$, or $H_2O$, for example. In a case of obtaining the thicker zirconium oxide layer 52, the process returns to the initial application step after the degreasing step, and then, the drying step and the degreasing step may be repeated. After the degreasing step, the dried film is heated at 750° C. to 850° C. held for approximately 10 seconds to 3 minutes, to perform crystallization (pre-firing step). In the pre-firing step, when the heating time is long, the surface is roughened, voids on the fired boundary surface are generated, and etching may not be performed. Therefore, the pre-firing step is preferably performed for short time. In a case of obtaining the thicker zirconium oxide layer 52, the process returns to the initial application step after the pre-firing step, and then, the drying step, the degreasing step, and the pre-firing step may be repeatedly performed. After the pre-firing step, the film is heated at 800° C. to 950° C. and held for approximately 1 hour to form the zirconium oxide layer 521 (final firing step). As a heating device used in the drying step, the degreasing step, the pre-firing step, and the final firing step, a rapid thermal annealing (RTA) device which performs heating by irradiation with an infrared lamp or a hot plate is used, for example.

The zirconium oxide layer 521 formed of zirconium oxide formed by the liquid phase method has a particulate crystal structure, as described above.

Next, as shown in FIG. 5E, the entire surface of the zirconium oxide layer 521 is patterned to remove the zirconium oxide layer 521 laminated on the zirconium oxide layer 522, and the zirconium oxide layer 522 is exposed. This patterning may be performed by a well-known dry etching or ion milling.

Next, as shown in FIG. 6A, the first electrode 60 is formed on the entire surface on the vibrating plate 50. The material of the first electrode 60 is not particularly limited, but it is necessary to use a material which does not lose conductivity due to oxidation or diffusion of a material contained in the piezoelectric layer 70 at the time of heat treatment (generally, equal to or higher than 500° C.) when forming the piezoelectric layer 70. Accordingly, as the material of the first electrode 60, metal such as platinum or iridium which does not lose conductivity at a high temperature, conductive oxide such as iridium oxide or lanthanum nickel oxide, and a laminated material of these materials is used. The first electrode 60 may be, for example, formed by using a gas phase method such as a sputtering method, a physical vapor deposition (PVD) method, or a laser ablation method, or a liquid phase method such as a spin coating method. An adhesive layer for ensuring adhesiveness may be used between the conductive material described above and the vibrating plate 50. In this embodiment, although not particularly shown, titanium is used as the adhesive layer. Zirconium, titanium, or titanium oxide may be used as the adhesive layer. The forming method of the adhesive layer is the same as the forming method of the electrode material. A control layer for controlling crystal growth of the piezoelectric layer 70 may be formed on the surface of the electrode (side where the piezoelectric layer 70 is formed). In this embodiment, titanium is used for controlling crystals of the piezoelectric layer 70 (PZT). Sine titanium is introduced into the piezoelectric layer 70 when forming the piezoelectric layer 70, titanium is not present as a film after forming the piezoelectric layer 70. As the crystal control layer, conductive oxide having a perovskite type crystal structure such as lanthanum nickel oxide may be used. The forming method of the crystal control layer is the same as the forming method of the electrode material. It is desirable that the insulating crystal control layer is not present between the piezoelectric layer 70 and the first electrode 60, after forming the piezoelectric layer 70. This is because that the crystal control layer and the capacitor of the piezoelectric layer 70 are connected in series, and accordingly, an electric field applied to the piezoelectric layer 70 decreases. As in this embodiment, by using titanium as an orientation control layer, the heat treatment is performed originally for obtaining oxide (insulator), but since the orientation control layer is introduced into the piezoelectric layer 70, it does not present as a film.

Next, in this embodiment, the piezoelectric layer 70 formed of lead zirconate titanate (PZT) is formed. Here, in this embodiment, the piezoelectric layer 70 is formed by using a so-called sol-gel method which obtains the piezoelectric layer 70 formed of metal oxide by coating and drying a so-called sol which is obtained by dissolving and dispersing a metal complex in a solvent to convert into gel and baking the gel at a high temperature. The manufacturing method of the piezoelectric layer 70 is not limited to a sol-gel method, and a metal-organic decomposition (MOD) method, or a physical vapor deposition (PVD) method such as a sputtering method or a laser ablation method may be used, for example. That is, the piezoelectric layer 70 may be formed by using any of a liquid phase method and a gas phase method. In this embodiment, the piezoelectric layer 70 is formed by laminating a plurality of piezoelectric films 74.

Specifically, as shown in FIG. 6B, the first electrode 60 and a first layer of the piezoelectric film 74 are patterned at the same time so that side surfaces thereof are tilted, at a stage where the first layer of the piezoelectric film 74 is formed on the first electrode 60. The patterning of the first electrode 60 and the first layer of the piezoelectric film 74 may be performed by performing dry etching such as reactive ion etching (RIE) or ion milling, for example.

Here, in a case of forming the first layer of the piezoelectric film 74 after patterning the first electrode 60, for example, since the first electrode 60 is patterned by performing a photolithography step, ion milling, and ashing, the surface of the first electrode 60 or a crystal seed layer such as titanium (not shown) provided on the surface thereof may be altered. By doing so, even when the piezoelectric film 74 is formed on the altered surface, excellent crystal properties of the piezoelectric film 74 are not obtained, and since second and subsequent layers of the piezoelectric film 74 are also subjected to crystal growth by being affected by the crystal state of the first layer of the piezoelectric film 74, it is difficult to form the piezoelectric layer 70 having excellent crystal properties.

Compared thereto, when the first layer of the piezoelectric film 74 is formed and then patterned at the same time as the first electrode 60, the first layer of the piezoelectric film 74 has strong properties as a seed for excellent crystal growth of the second and subsequent layers of the piezoelectric film 74 compared to a crystal seed such as titanium, and crystal growth of the second and subsequent layers of the piezoelectric film 74 are not significantly affected, although an extremely thin altered layer is formed on the surface layer by patterning.

When forming the second and subsequent layers of the piezoelectric film 74 on the vibrating plate 50 exposed before forming the second layer of the piezoelectric film 74, a crystal control layer (intermediate crystal control layer) may be used. In this embodiment, titanium is used as the intermediate crystal control layer. The intermediate crystal control layer formed of titanium is introduced to the piezoelectric film 74 when forming the piezoelectric film 74, in the same manner as titanium of the crystal control layer formed on the first electrode 60. In addition, in a case where the intermediate crystal control layer becomes an intermediate electrode or a dielectric of a capacitor connected in series, the piezoelectric characteristics are decreased. Accordingly, it is desirable that the intermediate crystal control layer is introduced to the piezoelectric film 74 (piezoelectric layer 70) and does not remain as a film after forming the piezoelectric layer 70.

Next, as shown in FIG. 6C, the piezoelectric layer 70 formed of the plural layers of the piezoelectric film 74 is formed by laminating the second and subsequent layers of the piezoelectric film 74.

In addition, the second and subsequent layers of the piezoelectric film 74 are continuously formed on the vibrating plate 50, on the side surfaces of the first electrode 60 and the first layer of the piezoelectric film 74, and on the first layer of the piezoelectric film 74.

When performing the piezoelectric layer 70 as described above, the diffusion of components contained in the piezoelectric layer 70, for example, lead (Pb) or bismuth (Bi) is prevented by using the zirconium oxide layer 52.

Next, as shown in FIG. 7A, the piezoelectric layer 70 is patterned to correspond to each pressure generation chamber 12. In this embodiment, the patterning is performed by so-called photolithography for providing a mask (not shown) formed on the piezoelectric layer 70 in a predetermined shape and etching the piezoelectric layer 70 through this mask. The patterning of the piezoelectric layer 70 may be performed by dry etching such as reactive ion etching or ion milling and may be performed by wet etching using an etching solution, for example.

Next, as shown in FIG. 7B, the second electrode 80 is formed over one surface side (surface side on which the piezoelectric layer 70 is formed) of the flow path formation substrate wafer 110, that is, on the side surface where the piezoelectric layer 70 is patterned, on the vibrating plate 50, and on the first electrode 60.

Next, although not shown, the lead electrode 90 is formed and patterned in a predetermined shape (see FIGS. 2A and 2B).

Next, as shown in FIG. 8A, a protection substrate wafer 130 which is a silicon wafer and is the plurality of protection substrates 30 is bonded to the piezoelectric element 300 side of the flow path formation substrate wafer 110 through the adhesive 35 (see FIGS. 2A and 2B) and then the flow path formation substrate wafer 110 is set to be thin to have a predetermined thickness.

Next, as shown in FIG. 8B, a mask film 55 is newly formed on the flow path formation substrate wafer 110 and is patterned in a predetermined shape. Then, as shown in FIG. 8C, the flow path formation substrate wafer 110 is subjected to anisotropic etching (wet etching) using an alkaline solution such as KOH through the mask film 55, and accordingly the pressure generation chamber 12, the ink supply path 13, the communication path 14, and the communication portion 15 corresponding to the piezoelectric element 300 are formed.

After that, unnecessary portions of outer periphery portions of the flow path formation substrate wafer 110 and the protection substrate wafer 130 are removed by cutting the portions by dicing or the like, for example. The nozzle plate 20 through which the nozzle openings 21 are penetrated is bonded to the surface of the flow path formation substrate wafer 110 on a side opposite the protection substrate wafer 130, the compliance substrate 40 is bonded to the protection substrate wafer 130, and the flow path formation substrate wafer 110 and the like are divided into flow path formation substrates 10 and the like, each of which are in one chip size as shown in FIG. 1, and therefore, the ink jet type recording head of the embodiment is obtained.

In this embodiment, among the zirconium oxide layer 52 of the vibrating plate 50, the zirconium oxide layer 521 having particulate crystal is provided in the first area p and some parts of the second areas q on the outer sides thereof, and the zirconium oxide layer 522 formed of columnar crystal is provided in the remaining second areas q and the third areas r, but there is no particular limitation. Hereinafter, other embodiments will be described.

Embodiment 2

FIG. 9 is a sectional view of an ink jet recording head according to Embodiment 2. The same reference numerals are used for the same parts in Embodiment 1 and only the parts changed from those in Embodiment 1 will be described.

As shown in FIG. 9, a zirconium oxide layer 52A includes a first layer 521A which is provided in the first area p corresponding to the first electrode 60 and in the second areas q which are areas corresponding to the piezoelectric layer 70 on the outer sides thereof, and a second layer 522A which is provided on the oxide layer 51 and continuously provided in the first area p, the second areas q, the third areas r, and the outer sides thereof. The first layer 521A is formed of zirconium oxide containing particulate crystal and the second layer 522A is formed of zirconium oxide containing columnar crystal.

As shown in FIG. 10A, when manufacturing the recording head, the second layer 522A is laminated on the oxide layer 51 by the gas phase method, the first layer 521A is laminated by the liquid phase method, the first electrode 60 is provided for patterning, and then, the piezoelectric layer 70 is laminated. After that, as shown in FIG. 10B, by patterning the first layer 521A together with the piezoelectric layer 70, the zirconium oxide layer 52A is formed.

In Embodiment 2, the first area p and the second areas q have a laminated structure including the second layer 522A having a columnar crystal structure and the first layer 521A having a particulate crystal structure, adhesiveness between the first layer 521A, the first electrode 60 and the piezoelectric layer 70 is ensured, the third area r is formed of the second layer 522A having excellent toughness, and accordingly, reliability is improved.

Since a thickness of the zirconium oxide layer 52A in the first area p and the second areas q is greater than a thickness thereof in the third areas r, the vibrating plate in a portion of the piezoelectric element is thick, the arms have a thin structure, the displacement efficiency is improved, the rapid driving can be performed, and large dots are discharged.

Embodiment 3

FIG. 11 is a sectional view of an ink jet recording head according to Embodiment 3. The reference numerals are used for the same parts in Embodiment 1 and only the parts changed from those in Embodiment 1 will be described.

As shown in FIG. 11, a zirconium oxide layer 52B includes a first layer 521B which is provided in the first area p corresponding to the first electrode 60, and a second layer 522B which is provided on the oxide layer 51 and continuously provided in the first area p, the second areas q, the third areas r, and the outer sides thereof. The first layer 521B is formed of zirconium oxide containing particulate crystal and the second layer 522B is formed of zirconium oxide containing columnar crystal.

As shown in FIG. 12A, when manufacturing the recording head, the second layer 522B is laminated on the oxide layer 51 by the gas phase method, the first layer 521B is laminated by the liquid phase method, and when performing the patterning by providing the first electrode 60, the first electrode 60 and the second layer 522B are patterned, and then, the same process as in the embodiments described above is executed, and the zirconium oxide layer 52B is formed.

In Embodiment 3, the first area p has a laminated structure including the second layer 522B having a columnar crystal structure and the first layer 521B having a particulate crystal structure, adhesiveness between the first layer 521B and the first electrode 60 is ensured, the third area r is formed of the second layer 522B having excellent toughness, and accordingly, reliability is improved.

Since a thickness of the zirconium oxide layer 52B in the first area p is greater than a thickness thereof in the third areas r, the vibrating plate in a portion of the piezoelectric element is thick, the arms have a thin structure, the displacement efficiency is improved, the rapid driving can be performed, and large dots are discharged.

(Others)

Hereinafter, Embodiments 1 to 3 have been described, but there is no limitation. The zirconium oxide configuring the zirconium oxide layer is not limited to $ZrO_2$, and yttrium may be added. Zirconia to which yttrium is added is known as yttrium-stabilized zirconia. Since toughness is improved, the zirconia is suitably used as particularly the zirconium oxide having columnar crystal. In addition, the zirconia may be used as the zirconium oxide having particulate crystal, and since the zirconia is formed by the liquid phase method, it is easy to add yttrium.

As shown in FIG. 13, the ink jet type recording head I of this embodiment is, for example, mounted on an ink jet type recording apparatus II. A recording head unit 1 including the ink jet type recording head I is provided so that an ink cartridge 2 configuring an ink supply unit is detachable, and a cartridge 3 on which the recording head unit 1 is mounted is provided on a carriage shaft 5 attached to an apparatus main body 4 to be movable in an axial direction. The recording head unit 1, for example, ejects a black ink composition and a color ink composition.

A driving force of a driving motor 6 is transferred to the carriage 3 through a plurality of gear wheels (not shown) and a timing belt 7, and accordingly the carriage 3 on which the recording head unit 1 is mounted is moved along the carriage shaft 5. Meanwhile, a platen 8 is provided on the apparatus main body 4 along the carriage shaft 5, and a recording sheet S which is a recording medium such as paper which is fed by a paper feeding roller (not shown) is wound on the platen 8 to be transported.

In the invention, it is possible to realize equalization in ejecting characteristics while preventing breakage of the piezoelectric element 300 configuring the ink jet type recording head I as described above. As a result, it is possible to realize the ink jet type recording apparatus II having improved printing quality and increased durability.

In the examples described above, an apparatus in which the ink jet type recording head I is mounted on the carriage 3 and moves in a main scanning direction is used as the ink jet type recording apparatus II, but there is no particular limitation to this configuration. The ink jet type recording apparatus II may be, for example, a so-called line type recording apparatus in which the ink jet type recording head I is fixed and printing is performed by moving the recording sheet S such as paper in an auxiliary scanning direction.

In the examples described above, the ink jet type recording apparatus II has a configuration in which the ink cartridge 2 which is a liquid storage unit is mounted on the carriage 3, but there is no particular limitation. A liquid storage unit such as an ink tank may be fixed to the apparatus main body 4 and the storage unit and the ink jet type recording head I may be connected to each other through a supply pipe such as a tube. In addition, the liquid storage unit may not be mounted on the ink jet type recording apparatus.

Other Embodiments

Hereinabove, the embodiments of the invention have been described, but the basic configuration of the invention is not limited thereto.

For example, in the embodiments described above, the piezoelectric layer 70 of the active portion 310 is continuously provided, but the piezoelectric layer 70 may be provided independently for each active portion 310. For example, in the embodiments described above, the second electrode 80 is set as a common electrode of the plurality of active portions 310 and the first electrode 60 is set as an individual electrode of each active portion 310, but there is no particular limitation, and the first electrode 60 is set as a common electrode of the plurality of active portions 310 and the second electrode 80 is set as an individual electrode of each active portions 310.

For example, in the embodiments described above, the piezoelectric film 74 is formed by applying, drying, degreasing, and firing, but there is no particular limitation. For example, the piezoelectric film 74 may be formed by performing the firing after repeating the steps of application, drying, and degreasing several times, for example, twice.

In the embodiments described above, the invention has been described by using the ink jet type recording head as an example of the liquid ejecting head, but the invention is for general liquid ejecting heads. As the liquid ejecting head, various recording heads used in an image recording apparatus such as a printer, a color material ejecting head used in manufacturing a color filter such as a liquid crystal display, an electrode material ejecting head used in electrode forming such as an organic EL display or a field emission display (FED), a bioorganic material ejecting head used in bio chip manufacturing.

The invention is not only applied to the liquid ejecting head (ink jet type recording head) or the ultrasonic device, but also applied to an actuator device mounted on various devices or various sensors using a piezoelectric element.

REFERENCE SIGNS LIST

I Ink jet type recording head (liquid ejecting head)
II Ink jet type recording apparatus (liquid ejecting apparatus)
10 Flow path formation substrate
11 Partition wall
12 Pressure generation chamber
13 Ink supply path
14 Communication path
15 Communication portion
20 Nozzle plate
21 Nozzle opening
30 Protection substrate
31 Piezoelectric element holding portion
32 Manifold portion
33 Penetration hole
35 Adhesive
40 Compliance substrate
41 Sealing film
42 Fixed plate
43 Opening portion
50 Vibrating plate
51 Oxide layer
52, 52A, 52B Zirconium oxide layer
60 First electrode
70 Piezoelectric layer
71 Recess
80 Second electrode
90 Lead electrode
100 Manifold
300 Piezoelectric element
521, 521A, 521B Zirconium oxide layer (first layer)
522, 522A, 522B Zirconium oxide layer (second layer)

The invention claimed is:

1. A piezoelectric device comprising:
a substrate on which a plurality of recesses are defined;
a vibrating plate which is provided on one surface side of the substrate; and
a piezoelectric element which is provided over the vibrating plate and on which a first electrode, a piezoelectric layer, and a second electrode are laminated from the substrate side,
wherein the first electrode is formed to have a first width which is smaller than a dimension of the recess in a parallel arrangement direction of at least one recess, and the piezoelectric layer surrounds the first electrode and has a second width which is greater than the first width and smaller than a width of the recess in the parallel arrangement direction,
the vibrating plate contains a zirconium oxide layer, and
when an area of the zirconium oxide layer corresponding to the first electrode having the first width is set as a first area, areas of the zirconium oxide layer corresponding to areas where the piezoelectric layer extends from outer sides of the first area in the parallel arrangement direction to where the piezoelectric layer contacts the second electrode in the parallel arrangement direction are set as second areas, and areas of the zirconium oxide layer extending from where the piezoelectric layer contacts the second electrode in the parallel arrangement direction to where the recess contacts the substrate that defines the recess in the parallel arrangement direction are set as third areas,
wherein the zirconium oxide layer in the first area contains particulate crystal, and wherein the zirconium oxide layer in the third area contains columnar crystal and wherein the zirconium oxide layer in the first area and the zirconium oxide layer in the third area are side by side in the parallel arrangement direction.

2. The piezoelectric device according to claim 1, wherein the zirconium oxide layer contains particulate crystal in the second areas.

3. The piezoelectric device according to claim 1, wherein the zirconium oxide layer includes a first layer containing particulate crystal provided on the first electrode side in the thickness direction at least in the first area and a second layer containing columnar crystal provided on the substrate side.

4. The piezoelectric device according to claim 1, wherein a thickness of the zirconium oxide layer in the first area is greater than a thickness in the third area.

5. A piezoelectric device according to claim 1, wherein the zirconium oxide layer contains yttrium.

6. A liquid ejecting head comprising:
the piezoelectric device according to claim 1; and
nozzle openings which communicate with the recess to eject liquid.

7. A liquid ejecting apparatus comprising: the liquid ejecting head according to claim 6.

8. A manufacturing method of a piezoelectric device including
a substrate on which a plurality of recesses are provided,
a vibrating plate which is provided on one surface side of the substrate, and
a piezoelectric element which is provided over the vibrating plate and on which a first electrode, a piezoelectric layer, and a second electrode are laminated from the substrate side,
in which the first electrode is formed to have a first width which is smaller than a dimension of the recess in a parallel arrangement direction of at least one recess, and the piezoelectric layer surrounds the first electrode and has a second width which is greater than the first width and smaller than a width of the recess in the parallel arrangement direction,
the vibrating plate contains a zirconium oxide layer, and
when an area of the zirconium oxide layer corresponding to the first electrode having the first width is set as a first area, areas of the zirconium oxide layer corresponding to areas where the piezoelectric layer is provided on the outer side of the first area in the parallel arrangement direction are set as second areas, and areas of the zirconium oxide layer corresponding to the recess on the outer side of the second areas in the parallel arrangement direction are set as third areas,
wherein the zirconium oxide layer in the first area contains particulate crystal, and wherein the zirconium oxide layer in the third area contains columnar crystal,
the method comprising:
forming a portion of the zirconium oxide layer containing particulate crystal by using a liquid phase method; and
forming a portion of the zirconium oxide layer containing columnar crystal by oxidizing the zirconium layer formed by using a gas phase method and wherein the zirconium oxide layer in the first area and the zirconium oxide layer in the third area are side by side in the parallel arrangement direction.

9. A piezoelectric device according to claim 1,
wherein the zirconium oxide layer in the first area does not contain columnar crystal, and
wherein the zirconium oxide layer in the third area does not contain particulate crystal.

10. A piezoelectric device according to claim 1,
wherein the zirconium oxide layer in the first area contains both of particulate crystal and columnar crystal, and
wherein the zirconium oxide layer in the third area does not contain particulate crystal.

11. A piezoelectric device according to claim 1,
wherein the zirconium oxide layer in the first area and the zirconium oxide layer in the third area have the same position in a thickness direction.

\* \* \* \* \*